(12) United States Patent
Chang et al.

(10) Patent No.: US 8,247,877 B2
(45) Date of Patent: Aug. 21, 2012

(54) STRUCTURE WITH REDUCED FRINGE CAPACITANCE

(75) Inventors: Leland Chang, Yorktown Heights, NY (US); Isaac Lauer, Yorktown Heights, NY (US); Renee T. Mo, Hopewell Junction, NY (US); Jeffrey Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 12/550,543

(22) Filed: Aug. 31, 2009

(65) Prior Publication Data

US 2011/0049645 A1 Mar. 3, 2011

(51) Int. Cl.
  *H01L 29/78* (2006.01)
(52) U.S. Cl. ........... 257/410; 257/E29.255; 257/E21.19; 438/591
(58) Field of Classification Search .......... 257/410–412, 257/E29.255
  See application file for complete search history.

(56) References Cited

U.S. PATENT DOCUMENTS

| 6,566,210 | B2 | 5/2003 | Ajmera et al. |
| 6,633,070 | B2 | 10/2003 | Miura et al. |
| 6,724,053 | B1 | 4/2004 | Divakaruni et al. |
| 7,033,897 | B2 | 4/2006 | Chen et al. |
| 7,487,794 | B2 | 2/2009 | Gustafsson |
| 2006/0057797 | A1* | 3/2006 | Ajmera et al. ............. 438/199 |
| 2007/0252203 | A1* | 11/2007 | Zhu et al. ................. 257/345 |

* cited by examiner

*Primary Examiner* — Zandra Smith
*Assistant Examiner* — Paul Patton
(74) *Attorney, Agent, or Firm* — Cantor Colburn LLP; Vazken Alexanian

(57) ABSTRACT

A structure includes a substrate and a gate stack disposed on the substrate. The structure also includes a nitride encapsulation layer disposed on a side wall of the gate stack and which has been exposed to a plasma source. The structure also includes at least one other element contacting the nitride encapsulation layer in a region where the nitride encapsulation layer contacts the side wall of the gate stack.

15 Claims, 6 Drawing Sheets

STRUCTURE WITH REDUCED FRINGE CAPACITANCE

BACKGROUND

The present invention relates to semiconductors, and more specifically, to semiconductor structures having a gate stack.

Silicon dioxide has been used as a gate oxide material for decades. As transistors have decreased in size, the thickness of the silicon dioxide gate dielectric has steadily decreased to increase the gate capacitance and thereby drive current and device performance. As the thickness scales below 2 nm, leakage currents due to tunneling increase drastically, leading to unwieldy power consumption and reduced device reliability.

Replacing the silicon dioxide gate dielectric with a high-k material allows increased gate capacitance without the concomitant leakage effects. The term high-k dielectric refers to a material with a high dielectric constant (k) (as compared to silicon dioxide) used in semiconductor manufacturing processes which replaces the silicon dioxide gate dielectric. The implementation of high-k gate dielectrics is one of several strategies developed to allow further miniaturization of microelectronic components. Due to material compatibility issues, the use high-k gate dielectrics necessitates the use of metal gate electrodes rather than conventional polysilicon gate electrodes One problem with utilizing high-k gate dielectrics with metal gate electrodes comes from increased parasitic capacitance (Cof) relative to conventional poly-silicon gate electrodes. In conventional poly-silicon electrodes, the poly-silicon depletion in the sidewall aids in lowering the COF. Therefore, migration to a metal gate incurs a Cof penalty.

SUMMARY

According to one embodiment of the present invention, a structure including a substrate and a gate stack disposed on the substrate is disclosed. The structure also includes a nitride encapsulation layer disposed on a side wall of the gate stack and which has been exposed to a plasma source. The structure also includes at least one other element contacting the nitride encapsulation layer in a region where the nitride encapsulation layer contacts the side wall of the gate stack.

Another embodiment of the present invention is directed to an MHK transistor that includes a substrate, a gate stack disposed on the substrate and a nitride encapsulation layer disposed on a side wall of the gate stack. The nitride encapsulation layer of this embodiment has been exposed to a plasma source. The MHK transistor also includes at least one other element contacting the nitride encapsulation layer in a region where the nitride encapsulation layer contacts the side wall of the gate stack.

Another embodiment of the present invention is directed to a method of forming a structure. The method of this embodiment includes forming a substrate; forming gate stack on the substrate; depositing a layer of nitride on the substrate and the gate stack; exposing the layer of nitride to a plasma; and forming a spacer around the gate stack after exposing the nitride to the plasma.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

One approach to problems expressed above has been to provide a barrier to oxidation (such as a nitride) to encapsulate the high k dielectric and the associated metal gate to prevent excessive interfacial reoxidation. Unfortunately, the nitride encapsulation layers, as well as some of the metal nitride layers they may protect, are etched by a nitride spacer removal chemistries utilized in later processing steps. This etching may lead to yield loss due to particle regeneration and gate undercut. Additionally, as compared to standard gate re-oxidation or an oxide spacer used with an oxynitride poly-silicon gate stack, utilizing nitride encapsulation layers may contribute to excessive outer fringe capacitance.

Embodiments of the present invention are directed to methods of forming structures with gate stack that includes a high k dielectric and a metal gate. In one embodiment, an oxidized or damage region on a sidewall of a metal gate material is created though either an ozone or oxidation process (i.e., exposure to a plasma) or implanting particular directly in the metal gate material. During this step, the silicon surface is protected with a protective oxide layer and the high k dielectric and metal gate are protected by a nitride, such as, a multi-layer deposition (MLD) nitride. The nitride is, thus, oxidized and prevents nitride etchants from removing the encapsulation as well metal gate material. In spacer applications this may also serve to reduce outer fringe capacitance by converting the higher k nitride to a lower k oxide.

Figure 1:
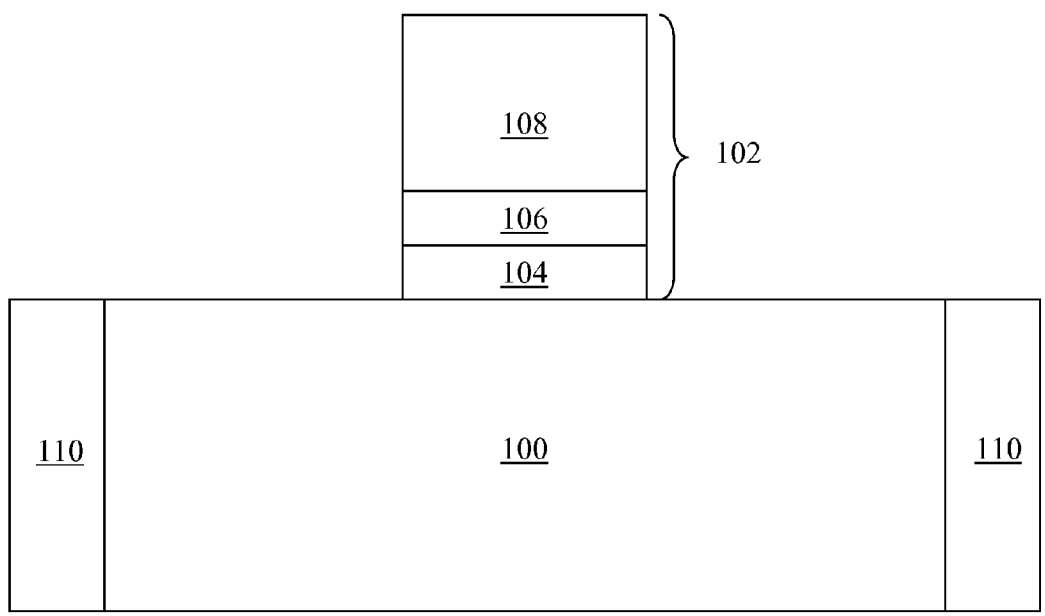
FIG. 1 shows a first process level in the formation of a structure according to one embodiment of the present invention.

FIG. 1 shows a first process level in the formation of a structure according to one embodiment of the present invention. The structure that is ultimately formed may be, for example, a transistor having a high k dielectric and a metal gate. Such a structure may be referred to herein as an MHK transistor.

A substrate 100 may have a gate stack 102 formed thereon. The gate stack 102 may include a gate dielectric 104 formed over the substrate 100. In one embodiment, the gate dielectric 104 may be formed of a dielectric having a high-k value as compared to silicon dioxide. An example of such a material is a hafnium based material such as $HfO_2$ or a similar material.

As used herein, a high-k dielectric shall refer to a material that has a k value of 3.0 or greater. In a particular embodiment, the high-k dielectric may have a k value between 4.0 and 100.

In one embodiment, the gate stack 102 may include a gate metal 106 disposed over the gate dielectric 104. In one embodiment, the gate metal 106 is disposed such that it directly contacts the gate dielectric 104. Of course, other materials may be disposed between the gate metal 106 and the gate dielectric 104 depending on the circumstances. In one embodiment, the gate metal 106 may be formed at least partially of a nitride. In a particular embodiment, the gate metal 106 is a so-called "thin nitride."

In one embodiment, the gate stack 102 may also include a polysilicon layer 108 disposed over the gate metal 106. In one embodiment, the polysilicon layer 108 may be disposed such that it directly contacts the gate metal 106. Of course, other materials may be disposed between the gate metal 106 and the polysilicon layer 108 depending on the circumstances.

In one embodiment, the substrate 100 may include one or more shallow trench isolation regions 110 disposed therein. The location the shallow trench isolation regions 110 may vary depending on the application and are shown in FIG. 1 by way of illustration only.

Figure 2:
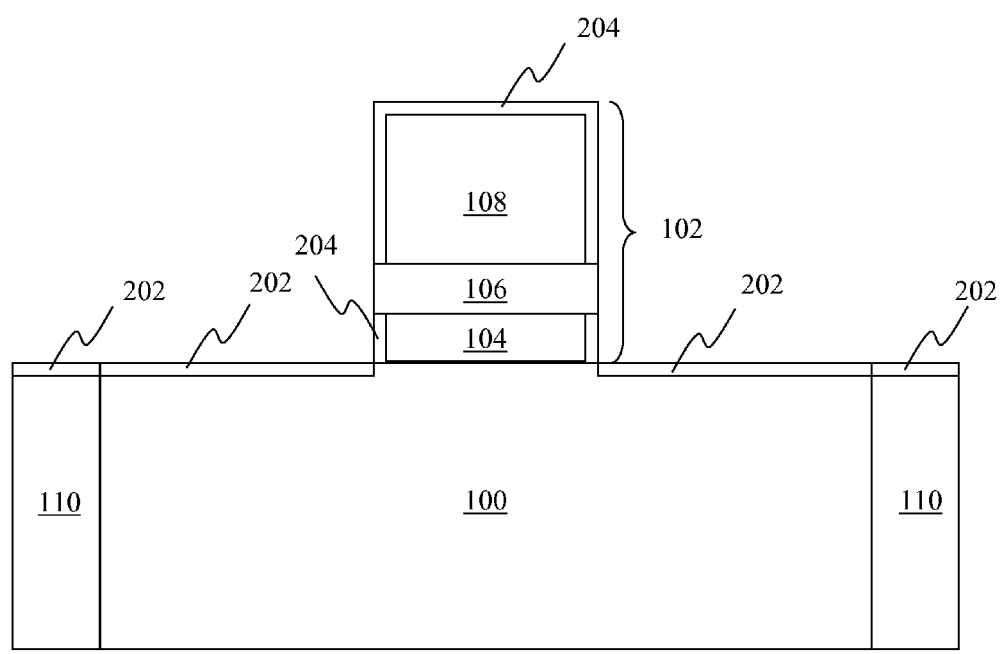
FIG. 2 shows a substrate with the gate stack disposed thereon according to another embodiment.

FIG. 2 shows the substrate 100 with the gate stack 102 disposed thereon according to another embodiment. In the embodiment shown in FIG. 2, at some point in the processing flow, the substrate 100 and the gate stack 102 where exposed to either a chemical or physical process that caused oxidation of a portion (oxidized portion) of the silicon based elements of the substrate 100 and the gate stack 102. In the case of the substrate 100, these elements include the substrate 100 itself and the shallow trench isolation regions 110. In FIG. 2, the oxidized portions of the substrate 100 are assigned reference numeral 202. In the case of the gate stack 102, these elements includes the gate oxide 104 and the polysilicon layer 108. In FIG. 2, the oxidized portions of the gate stack 102 are assigned reference numeral 204. The gate metal 104 does not include an oxidized portion.

Regardless of how formed (as in either FIG. 1 or FIG. 2), further steps in the processing flow may involve exposure of the substrate 100 and gate stack 102 to nitride etchants. These etchants may include, for example, phosphoric acid. Such etchants may remove the typical thin nitride encapsulation layer that may be used to encapsulate the gate stack 102 and may, in some instances, damage the metal gate 106. One approach may have been to cover the nitride encapsulation layer with an additional oxide layer. However, the nitride encapsulation layer itself contributes to excessive outer fringe capacitance. To help alleviate these problems, a nitride encapsulation layer is disposed, according to one embodiment, over the gate stack 102 and the substrate 100. This nitride encapsulation layer is then exposed to an oxygen-based plasma that causes a portion of the nitride encapsulation layer to oxidize. This protects the nitride encapsulation layer from nitride etchants and also serves prevent excessive fringe capacitance by converting the high k nitride encapsulation layer to a lower k oxide. Of course, the oxidation of the nitride encapsulation layer could occur, for example by other processes such as, for example, in-situ steam generation (ISSG) oxidation.

Figure 3:
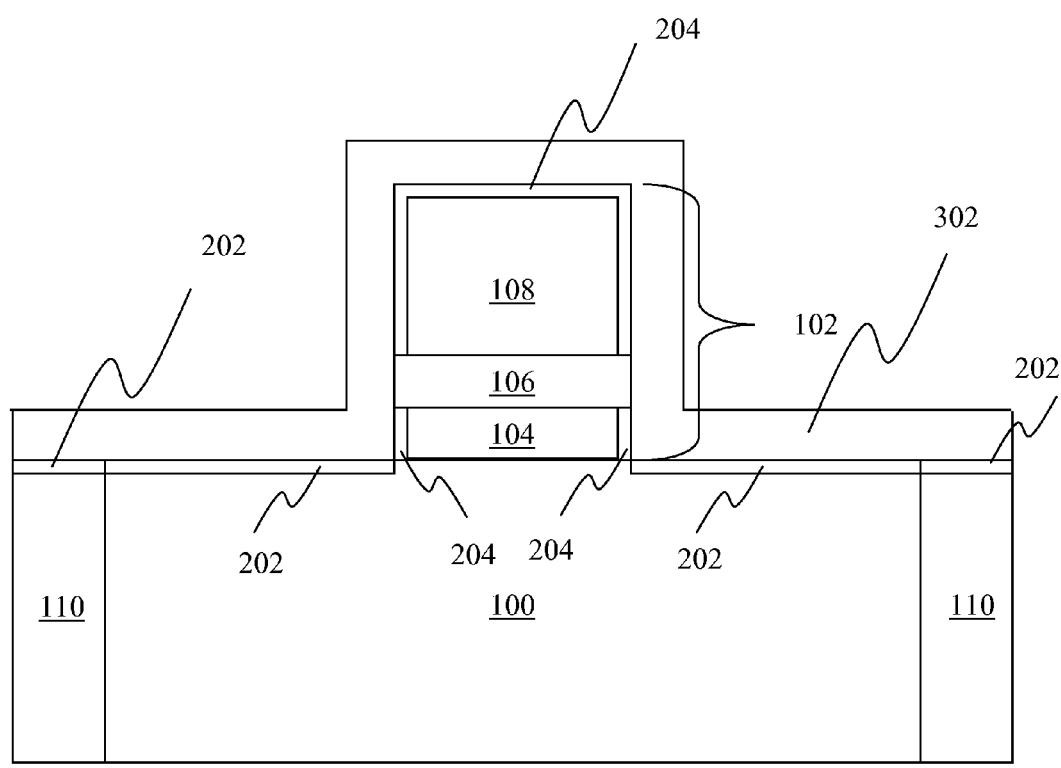
FIG. 3 shows the substrate and the gate stack as shown in FIG. 2 after a nitride layer has been deposited thereon.

FIG. 3 shows the substrate 100 and the gate stack 102 as shown in FIG. 2 after a nitride layer 302 has been deposited thereon. Of course, the substrate 100 and the gate stack 102 as shown in FIG. 1 could be used as well. The nitride encapsulation layer 302 may be a thin nitride layer formed by chemical vapor deposition (CVD), low pressure CVD (LPCVD) or atomic layer deposition (ALD) or as a multi-layer deposition (MLD) nitride.

In one embodiment, the nitride layer 302 is exposed to a plasma. The plasma may be an oxygen-based plasma. This exposure serves to oxidize a portion of the nitride layer 302. Consequently, it also converts the higher k nitride layer to a lower k oxide for at least a portion of the layer. Of course, such a conversion could be effected by other means such as, for example, ISSG oxidation.

Figure 4:
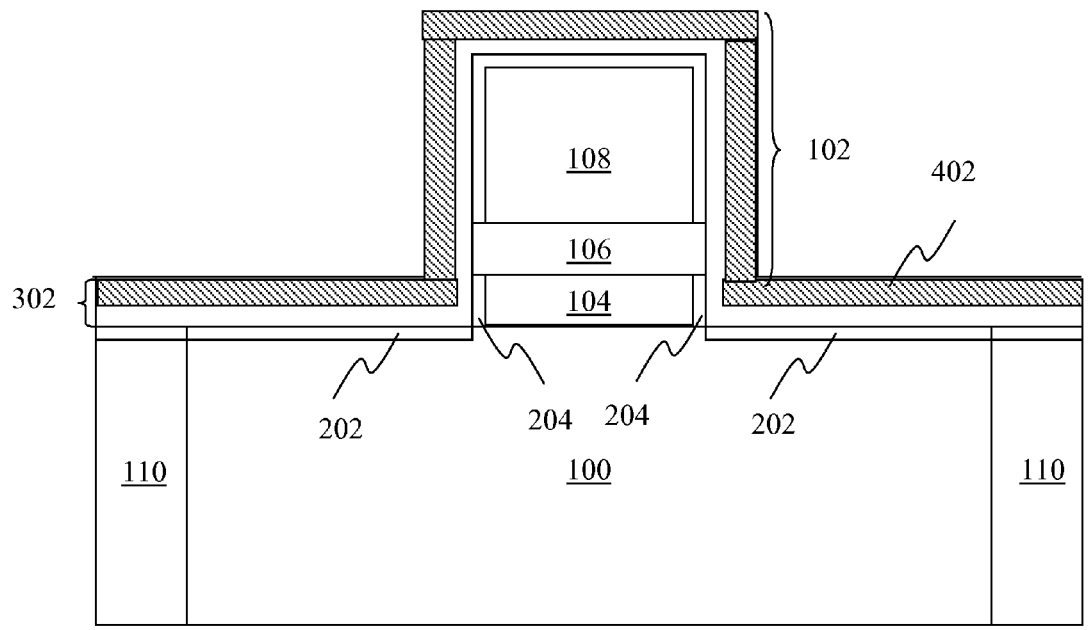
FIG. 4 shows the substrate and gate stack after the nitride encapsulation layer has been exposed to an oxidation technique.

FIG. 4 shows the substrate 100 and gate stack 102 after the nitride encapsulation layer 302 has been exposed to one or both of the oxidation techniques described above. The nitride encapsulation layer 302 now includes an oxidized portion 402. This oxidized portion 402 prevents later nitride etchants used later in the process flow from removing the encapsulation layer 302 as well as the metal gate material of the metal gate 106.

Figure 5:
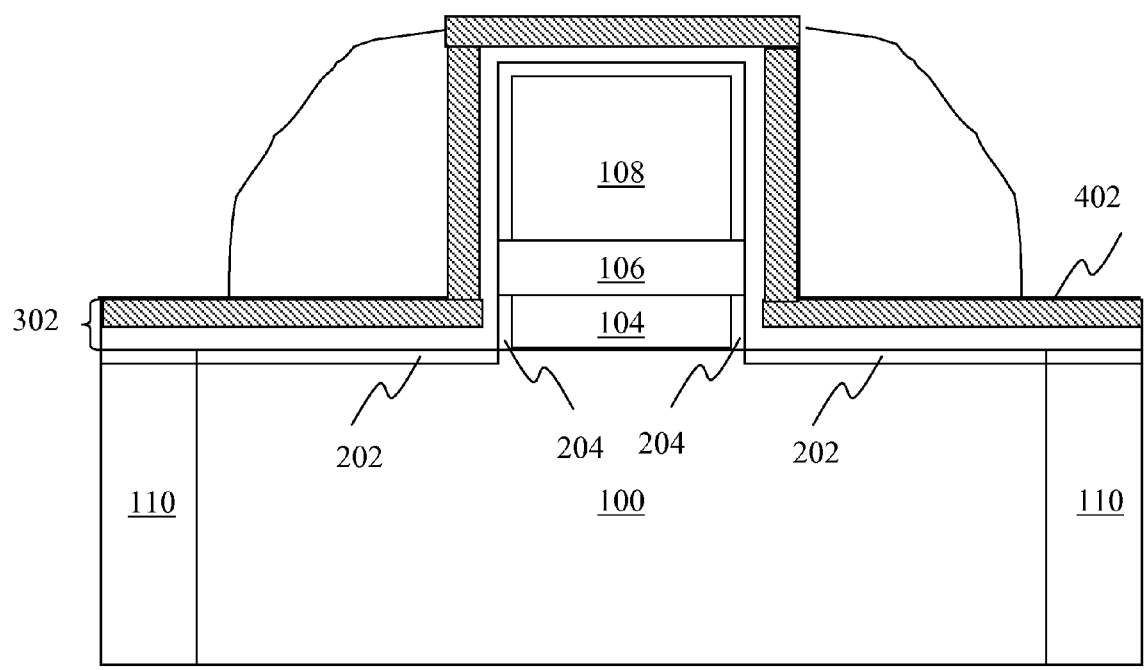
FIG. 5 shows the structure of FIG. 4 after a nitride based spacer has been formed thereon.

FIG. 5 shows the structure of FIG. 4 after a nitride based spacer 502 has been formed thereon. The nitride based space 502 may be a combination of a nitride and an oxide in one embodiment. If the nitride encapsulation layer 302 did not include an oxidized portion the nitride in the nitride encapsulation layer 302 may contact the spacer 502. The resulting mass of nitride material would then server to increase fringe capacitance which may not be desirable.

It shall be understood that any of the structures shown in FIGS. 1-5 may include additional materials embedded in the substrate 100. For example, the substrate 100 may include silicon germanium or other materials disposed therein.

Figure 6:
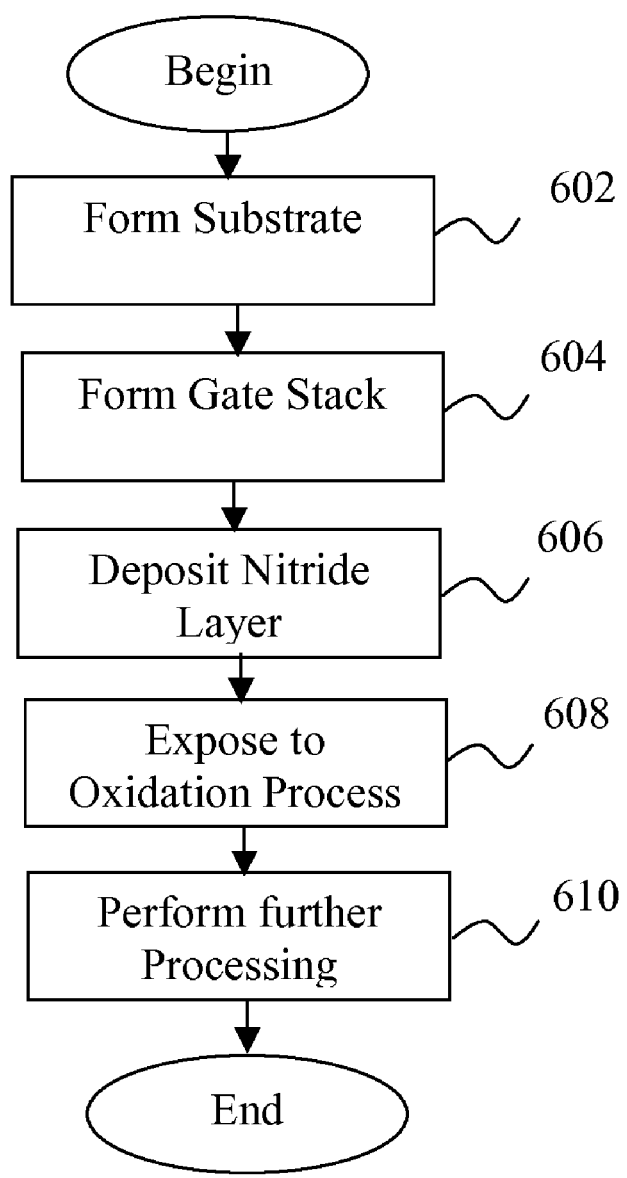
FIG. 6 is flow chart showing method according to one embodiment of the present invention.

FIG. 6 is flow chart showing method according to one embodiment of the present invention. At a block 602, a substrate is formed. The substrate may be formed of any type of material and may include other materials disposed within it. In one embodiment the substrate is formed of a silicon-based material.

At a block 604, a gate stack is formed on the substrate. The gate stack may include a high k dielectric and a metal gate in one embodiment.

At a block 606, a nitride layer is deposited. The layer may be deposited by chemical vapor deposition (CVD), low pressure CVD (LPCVD) or atomic layer deposition (ALD) or as a multi-layer deposition (MLD) nitride. The nitride layer may be deposited such that is contacts the substrate and the gate stack.

At a block 608, the nitride layer is exposed to an oxidation process. In one embodiment, this may include exposing the nitride layer to a plasma. In one embodiment, exposing the nitride layer to a plasma may include exposing the nitride layer to an oxygen-based plasma. In another embodiment, the oxidation may be a ISSG oxidation process.

At a block 610, additional processing steps may be performed but are not necessary. For example, block 610 may include forming nitride spacers around the gate stack.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A structure comprising:
    a substrate;
    a gate stack disposed on the substrate;
    a nitride encapsulation layer disposed on a side wall of the gate stack, the nitride encapsulation layer having been exposed to an oxygen containing plasma source; and
    at least one other element contacting the nitride encapsulation layer in a region where the nitride encapsulation layer contacts the side wall of the gate stack.

2. The structure of claim 1, wherein the substrate is silicon containing.

3. The structure of claim 1, wherein the gate stack includes dielectric and a gate material.

4. The structure of claim 3, wherein the dielectric is a high k dielectric and the gate material is formed of a metal.

5. The structure of claim 1, wherein the at least one other element is formed at least partially of a nitride.

6. The structure of claim 1, wherein the substrate has materials formed of a different material than the substrate disposed within the substrate.

7. A MHK transistor comprising:
    a substrate;
    a gate stack disposed on the substrate;
    a nitride encapsulation layer disposed on a side wall of the gate stack, the nitride encapsulation layer having been exposed to an oxygen-containing plasma source; and
    at least one other element contacting the nitride encapsulation layer in a region where the nitride encapsulation layer contacts the side wall of the gate stack.

8. The MHK transistor of claim 7, wherein the substrate is silicon containing.

9. The MHK transistor of claim 8, further comprising:
    a material different than the substrate disposed within the substrate.

10. The MHK transistor of claim 1, wherein the gate stack includes high k dielectric and a gate formed of a metal.

11. The structure of claim 1, structure of claim 1, wherein the at least one other element is formed at least partially of a nitride.

12. A method of forming a structure, the method comprising:
    forming a substrate;
    forming gate stack on the substrate;
    depositing a layer of nitride on the substrate and the gate stack;
    exposing the layer of nitride to an oxygen-containing plasma; and
    forming a spacer around the gate stack after exposing the nitride to the plasma.

13. The method of claim 12, wherein the spacer is formed at least partially of a nitride.

14. The method of claim 12, wherein the gate stack includes a high k dielectric and a gate formed of a metal material.

15. The method of claim 12, further comprising:
    exposing the structure to a nitride etchant after the nitride encapsulation layer has been exposed to the plasma.

* * * * *